(12) United States Patent
Kim et al.

(10) Patent No.: US 8,153,462 B2
(45) Date of Patent: Apr. 10, 2012

(54) METHOD OF MANUFACTURING LIQUID CRYSTAL DISPLAY DEVICE

(75) Inventors: Kang-Il Kim, Gyeonggi-do (KR);
Joon-Young Yang, Gyeonggi-do (KR);
Kye-Chan Song, Seoul (KR); Soopool Kim, Seoul (KR); Young-Kwon Kang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 133 days.

(21) Appl. No.: 12/568,824

(22) Filed: Sep. 29, 2009

(65) Prior Publication Data

US 2010/0099205 A1     Apr. 22, 2010

(30) Foreign Application Priority Data

Oct. 22, 2008  (KR) .................. 10-2008-0103775

(51) Int. Cl.
*H01L 21/00* (2006.01)

(52) U.S. Cl. .................. 438/30; 438/705; 257/E21.535; 216/23; 349/46

(58) Field of Classification Search .................. 438/722, 438/705, 96, 80, 658, 659, 30; 216/23, 47, 216/57, 62; 257/E21.411, E21.483, E21.486, 257/E21.305, 535; 349/46
See application file for complete search history.

(56) References Cited

U.S. PATENT DOCUMENTS

| | | | | |
|---|---|---|---|---|
| 5,736,002 A * | 4/1998 | Allen et al. | .................. | 438/705 |
| 6,193,911 B1 * | 2/2001 | Hunt et al. | ................. | 252/518.1 |
| 6,589,882 B2 * | 7/2003 | Andreas et al. | ................ | 438/745 |
| 6,649,131 B2 * | 11/2003 | Seo et al. | ......................... | 423/42 |
| 7,465,408 B1 * | 12/2008 | Avanzino | ...................... | 216/100 |
| 2003/0178656 A1 * | 9/2003 | Kwon et al. | ................... | 257/288 |
| 2004/0242000 A1 * | 12/2004 | Jo et al. | ......................... | 438/689 |
| 2008/0002125 A1 | 1/2008 | Kim | | |
| 2008/0166838 A1 * | 7/2008 | Long et al. | .................... | 438/151 |

FOREIGN PATENT DOCUMENTS

CN           101097320 A      1/2008

* cited by examiner

*Primary Examiner* — Caridad Everhart

(74) *Attorney, Agent, or Firm* — Morgan, Lewis & Bockius LLP

(57) ABSTRACT

A method of manufacturing a liquid crystal display device is provided which includes ashing first and second photoresist patterns, whereby a copper oxide film is formed at portions of a data line and a source-drain pattern exposed between the ashed first and second photoresist patterns and between the ashed first and second portions of the first photoresist pattern; deoxidizing or removing the copper oxide film; performing a plasma treatment to change the exposed portions of the data line and the source-drain pattern into a copper compound; removing the copper compound using a copper compound removing solution to form source and drain electrodes below the ashed first and second portions, respectively, wherein the copper compound removing solution substantially has no reaction with the copper group material; dry-etching a portion of an ohmic contact layer between the source and drain electrodes using the source and drain electrodes as an etching mask, the ohmic contact layer formed by patterning the impurity-doped amorphous silicon layer.

10 Claims, 15 Drawing Sheets

Dry-etching

METHOD OF MANUFACTURING LIQUID CRYSTAL DISPLAY DEVICE

The present invention claims the benefit of Korean Patent Application No. 2008-0103775, filed in Korea on Oct. 22, 2008, which is hereby incorporated by reference for all purposes as if fully set forth herein.

BACKGROUND OF THE INVENTION

1. Field of the Invention

The present invention relates to a liquid crystal display device, and more particularly, to a method of manufacturing a liquid crystal display (LCD) device.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

FIG. 1 is a schematic plan view illustrating an array substrate of an LCD device according to the related art.

Referring to FIG. 1, the array substrate includes a gate line 20 and a data line 30 crossing each other to define a pixel region P on a substrate 10. A thin film transistor T is in the pixel region P and connected to the corresponding gate and data lines 20 and 30. The thin film transistor T includes a gate electrode 25, a semiconductor layer, and source and drain electrodes 32 and 34. The semiconductor layer includes an active layer 40 of intrinsic amorphous silicon and an ohmic contact layer of impurity-doped amorphous silicon.

A pixel electrode 70 is in the pixel region P and connected to the thin film transistor T. The pixel electrode 70 is connected to the drain electrode 34 through a drain contact hole CH1 exposing the drain electrode 34.

FIGS. 2A to 2G are cross-sectional views, taken along a line II-II of FIG. 1, illustrating processes of manufacturing the array substrate of FIG. 1.

Referring to FIG. 2A, a metal layer is deposited on a substrate 10. The substrate 10 includes a switching region S, a pixel region P and a data region D. The metal layer is patterned with a first mask to form a gate line (20 of FIG. 1) and a gate electrode 25. The gate electrode is formed in the switching region S. The metal layer is made of one of copper (Cu), molybdenum (Mo), aluminum (Al), aluminum alloy, chromium (Cr). A gate insulating layer 45 is formed on the substrate 10 having the gate electrode 25.

Referring to FIG. 2B, an intrinsic amorphous silicon layer and an impurity-doped amorphous silicon layer are formed on the gate insulating layer 45 and patterned with a second mask to form an active layer 40 and an ohmic contact layer 41 on the active layer 40. A semiconductor layer 42 includes the active layer 40 and the ohmic contact layer 41.

Referring to FIG. 2C, a metal layer 75 and a photoresist layer 80 are sequentially deposited on the substrate 10 having the semiconductor layer 42. The metal layer 75 is made of one of copper (Cu), molybdenum (Mo), aluminum (Al), aluminum alloy, chromium (Cr).

A third mask is over the photoresist layer 80. The third mask includes a transmissive portion T1 and a blocking portion T2. The photoresist layer 80 may be a positive type photoresist. The transmissive portion T1 is located between the blocking portions T2 corresponding to the switching region S. Further, the blocking portion T2 is located corresponding to the data region D.

Referring to FIG. 2D, a light exposure process and a developing process are performed for the photoresist layer (80 of FIG. 2C) to form first to third photoresist patterns 81 to 83. A distance CD1 between the first and second photoresist patterns 81 and 82 is about 5 μm which is the same as a design value of the third mask.

Referring to FIG. 2E, the metal layer (75 of FIG. 2D) is wet-etched using the first to third photoresist patterns 81 to 83 as an etching mask to form source and drain electrodes 32 and 34 and a data line 30. When the metal layer is made of one of copper (Cu), molybdenum (Mo), aluminum (Al), aluminum alloy, chromium (Cr), the metal layer can not be dry-etched, the metal layer is thus wet-etched. A hydrogen peroxide ($H_2O_2$) group etching solution is used as an etchant for the metal layer. However, in the wet-etching process, the etchant may flows below side portions of the first and second photoresist patterns 81 and 82, thus over-etching may occur for the metal layer. This over-etching causes widths of the source and drain electrodes 32 and 34 and the data line 30 to be reduced. Accordingly, a distance CD2 between the source and drain electrodes 32 and 34 is more than the distance CD1 which is a desired distance between the source and drain electrodes 32 and 34.

Referring to FIG. 2F, the ohmic contact layer 41 is dry-etched using the source and drain electrodes 32 and 34 as an etching mask. Through the dry-etching process, the separated ohmic contact layers 41 are formed, and a distance between the ohmic contact layers 41 is the distance CD2 between the source and drain electrodes 32 and 34. Accordingly, the distance CD2 is desired to be about 5 μm, but the distance CD2 increases at each of both sides by about 1 μm. In other words, the distance CD2 becomes about 7 μm.

A portion of the active layer 40 corresponding to the distance CD2 is referred to as a channel portion CH. Because of the over-etching of the source and drain electrodes 32 and 34, a length of the channel portion CH increases more than designed. As a result, the over-etching causes change of the length of the channel portion CH, thus property of a thin film transistor is degraded.

After the dry-etching, the first to third photoresist patterns (81 to 83 of FIG. 2E) are stripped.

Referring to FIG. 2G, a passivation layer 55 is formed on the substrate 10 having the source and drain electrodes 32 and 34. The passivation layer 55 is patterned with a fourth mask to form a drain contact hole CH1 exposing the drain electrode 34.

A transparent conductive layer is formed on the passivation layer 55 and patterned with a fifth mask to form a pixel electrode 70. The pixel electrode 70 is connected to the drain electrode 34 through the drain contact hole CH1.

Through the above processes, the array substrate is manufactured. As described above, because of the over-etching in the wet-etching process of the source and drain electrodes, the length of the channel portion increases. Accordingly, the property of the thin film transistor is degraded, and display quality of the LCD device is thus degraded.

SUMMARY OF THE INVENTION

Accordingly, the present invention is directed to a method of manufacturing a liquid crystal display device that substantially obviates one or more of the problems due to limitations and disadvantages of the related art.

An advantage of the present invention is to provide a method of manufacturing a liquid crystal display device that can improve display quality.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a method of manufacturing a liquid crystal display device includes forming a gate line and a gate electrode on a substrate, the gate electrode in a switching region of the substrate; forming a gate insulating layer on the gate line and the gate electrode; forming an intrinsic amorphous silicon layer, an impurity-doped amorphous silicon layer and a copper group material layer which are sequentially located on the gate insulating layer, the copper group material being one of copper or copper alloy; forming first and second photoresist patterns on the copper group material layer, wherein the first photoresist pattern corresponds to the switching region and includes first to third portions, wherein the third portion is between the first and second portions and has a thickness less than a thickness of the second photoresist pattern and the first and second portions, and wherein the second photoresist pattern corresponds to a data region of the substrate; patterning the copper group material layer using the first and second photoresist patterns to form a source-drain pattern below the first photoresist pattern and a data line below the second photoresist pattern; ashing the first and second photoresist patterns to remove the second portion, whereby a copper oxide film is formed at portions of the data line and the source-drain pattern exposed between the ashed first and second photoresist patterns and between the ashed first and second portions; deoxidizing or removing the copper oxide film; performing a plasma treatment to change the exposed portions of the data line and the source-drain pattern into a copper compound after deoxidizing or removing the copper oxide film; removing the copper compound using a copper compound removing solution to form source and drain electrodes below the ashed first and second portions, respectively, wherein the copper compound removing solution substantially has no reaction with the copper group material; dry-etching a portion of an ohmic contact layer between the source and drain electrodes using the source and drain electrodes as an etching mask, the ohmic contact layer formed by patterning the impurity-doped amorphous silicon layer; and forming a pixel electrode connected to the drain electrode.

In another aspect, a method of manufacturing a liquid crystal display device includes forming a gate line and a gate electrode on a substrate, the gate electrode in a switching region of the substrate; forming a gate insulating layer on the gate line and the gate electrode; forming an active layer and an ohmic contact layer which are sequentially located on the gate insulating layer; forming a copper group material layer on the ohmic contact layer, the copper group material being one of copper or copper alloy; forming first to third photoresist patterns on the copper group material layer, wherein the first and second photoresist patterns correspond to the switching region, and wherein the second photoresist pattern corresponds to a data region of the substrate; performing a plasma treatment for the copper group material layer using the first to third photoresist patterns as a reaction mask, whereby portions of the copper group material layer between the first to third photoresist patterns are changed into a copper compound; removing the copper compound using a copper compound removing solution to form source and drain electrodes below the first and second photoresist patterns, respectively, and a data line below the third photoresist pattern, wherein the copper compound removing solution substantially has no reaction with the copper group material; dry-etching a portion of the ohmic contact layer between the source and drain electrodes using the source and drain electrodes as an etching mask; and forming a pixel electrode connected to the drain electrode.

In another aspect, a method of manufacturing a liquid crystal display device includes forming a gate line and a data line to define a pixel region on a substrate; forming a thin film transistor which includes a gate electrode, a semiconductor layer, and source and drain electrodes, forming the thin film transistor including: changing a portion of a copper group material layer into a copper compound, the copper group material being one of copper or copper alloy; removing the copper compound using a copper compound removing solution to form source and drain electrodes spaced apart from each other, wherein the copper compound removing solution substantially has no reaction with the copper group material; and removing a portion of the semiconductor layer between the source and drain electrodes; and forming a pixel electrode connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

Figure 1:
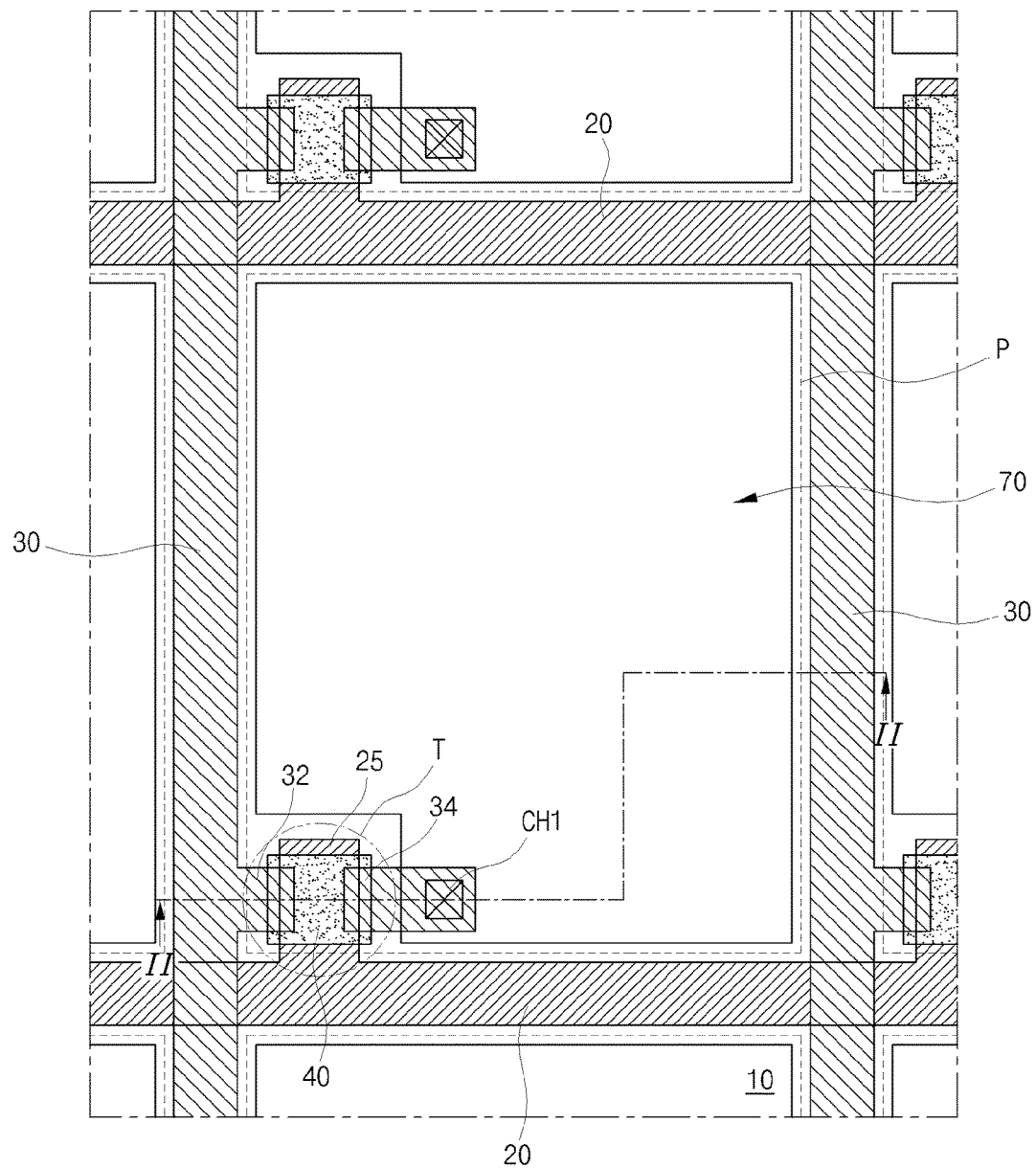
FIG. 1 is a schematic plan view illustrating an array substrate of an LCD device according to the related art.
Figure 2A:
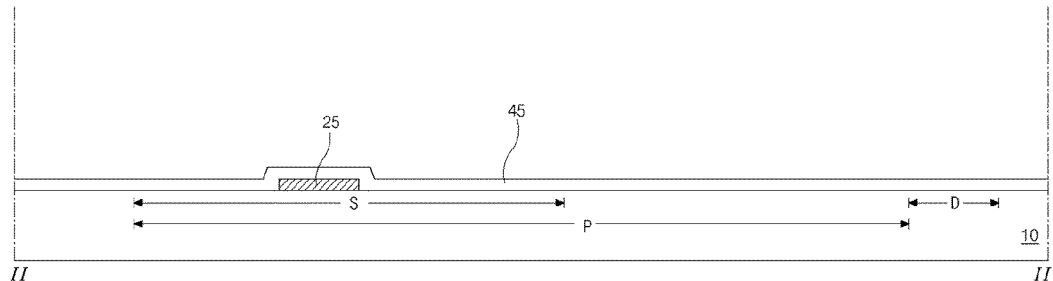
FIGS. 2A to 2G are cross-sectional views, taken along a line II-II of FIG. 1, illustrating processes of manufacturing the array substrate of FIG. 1.
Figure 2B:
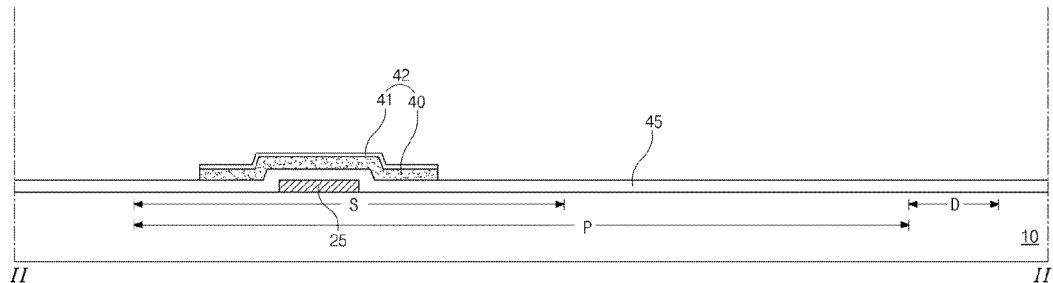
Figure 2C:
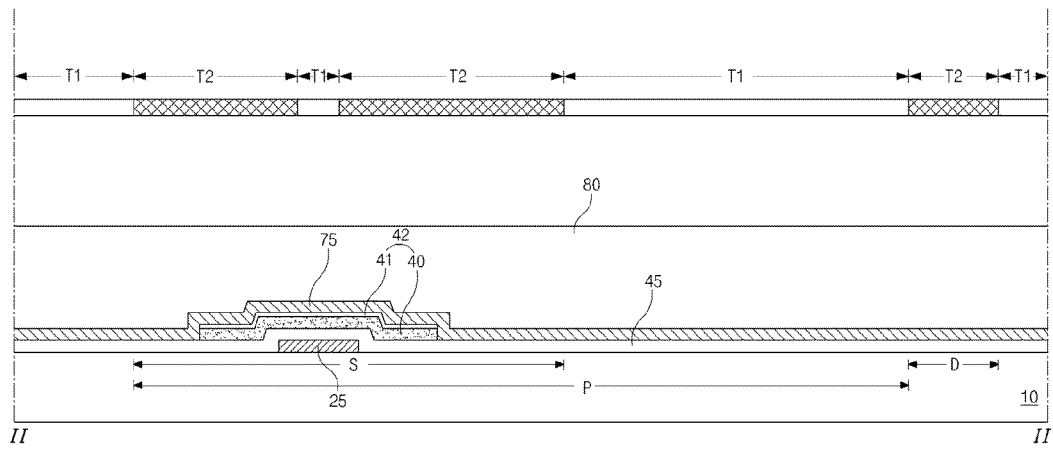
Figure 2D:
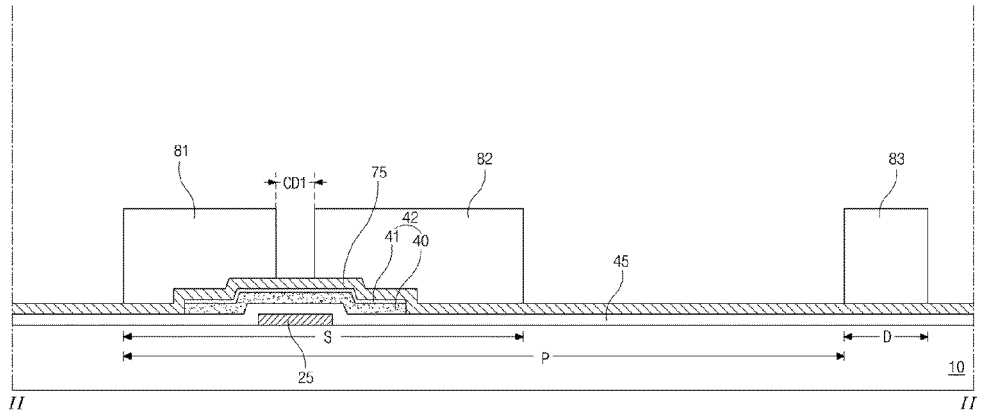
Figure 2E:
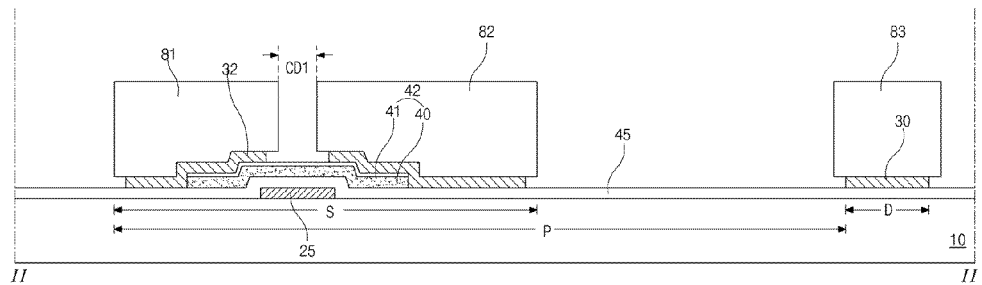
Figure 2F:
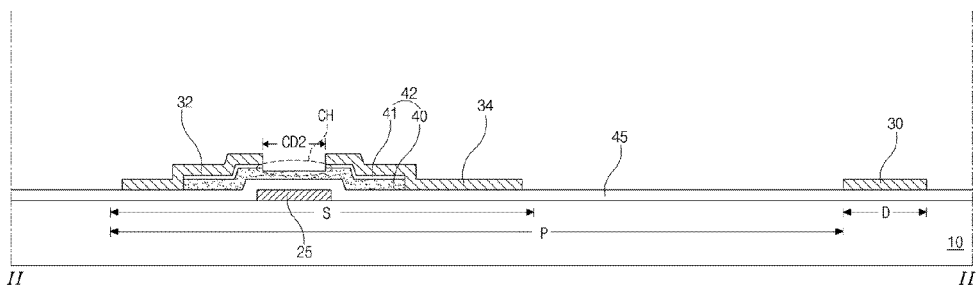
Figure 2G:
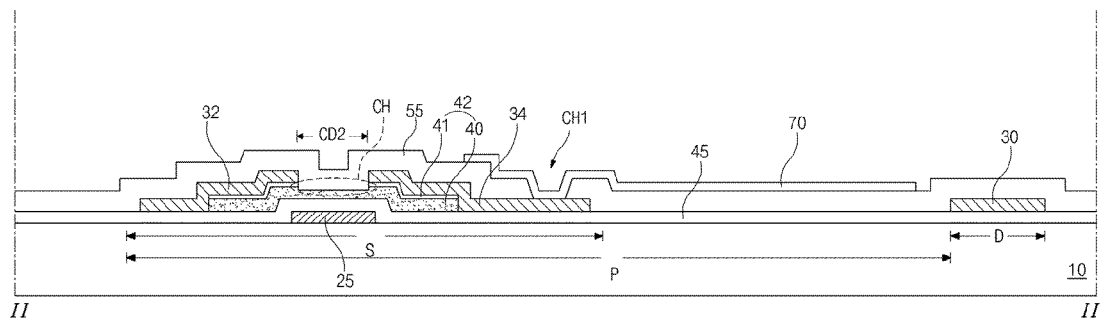
Figure 3:
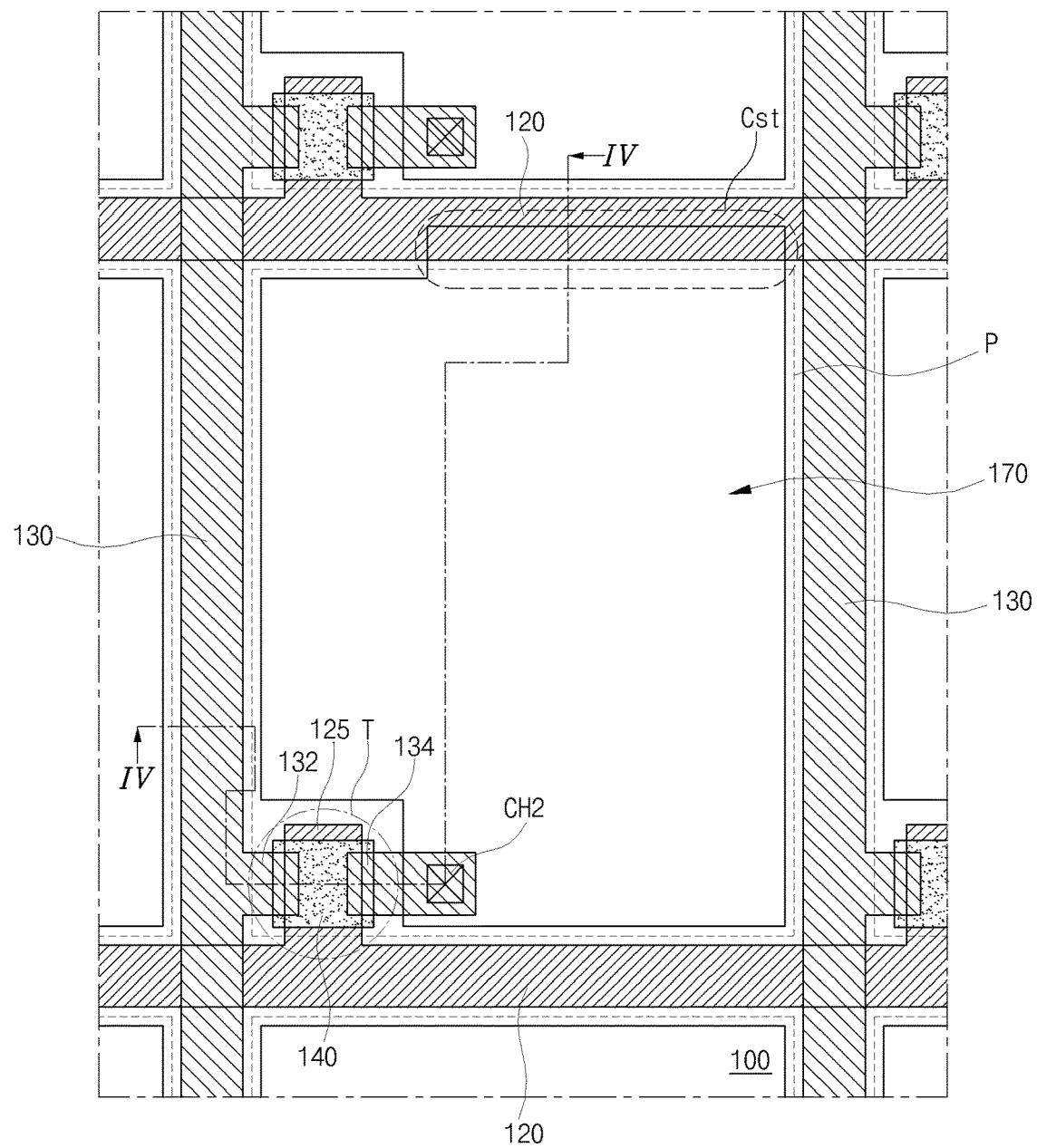
FIG. 3 is a plan view illustrating an array substrate of an LCD device according to a first embodiment of the present invention.

FIG. 3 is a plan view illustrating an array substrate of an LCD device according to a first embodiment of the present invention.

Referring to FIG. 3, the array substrate includes a gate line 120 and a data line 130 crossing each other to define a pixel region P on a substrate 100.

A thin film transistor T is in the pixel region P and connected to the corresponding gate and data lines 120 and 130. The thin film transistor T includes a gate electrode 125, a semiconductor layer, and source and drain electrodes 132 and 134. The gate electrode 125 is connected to the gate line 120, and the source electrode 132 is connected to the data line 130. The semiconductor layer includes an active layer 140 made of an intrinsic amorphous silicon and an ohmic contact layer of impurity-doped amorphous silicon. The ohmic contact layer includes two separate contact patterns below the source and drain electrodes 132 and 134, respectively.

A pixel electrode 170 is in the pixel region P and connected to the drain electrode 134 of the thin film transistor T through a drain contact hole CH2. The pixel electrode 170 may overlap the gate line 120 with an insulating layer therebetween to form a storage capacitor Cst.

FIGS. 4A to 4H are cross-sectional views, taken along a line IV-IV of FIG. 3, illustrating a method of manufacturing the array substrate of the LCD device according to the first embodiment of the present invention.

Figure 4A:
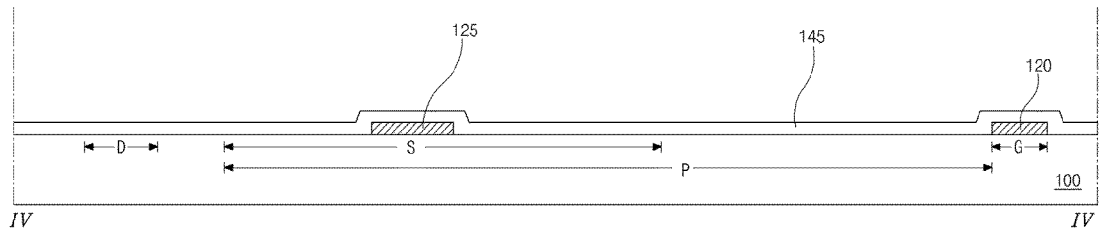
FIGS. 4A to 4H are cross-sectional views, taken along a line IV-IV of FIG. 3, illustrating a method of manufacturing the array substrate of the LCD device according to the first embodiment of the present invention.

Referring to FIG. 4A, a conductive material is deposited on a substrate 100. The substrate 100 includes a switching region S, a pixel region P, a gate region G and a data region D. The conductive material is patterned in a first mask process to form a gate line 120 and a gate electrode 125. The conductive material may be a metal which is one of copper (Cu), molybdenum (Mo), aluminum (Al), aluminum alloy and chromium (Cr), or a mixture thereof The gate line 120 corresponds to the gate region G, and the gate electrode 125 corresponds to the switching region S.

A gate insulating layer 145 is formed on the substrate 100 having the gate electrode 125. The gate insulating layer 145 may be made of an inorganic material. The inorganic material may be one of silicon oxide ($SiO_2$) and silicon nitride (SiNx).

Figure 4B:
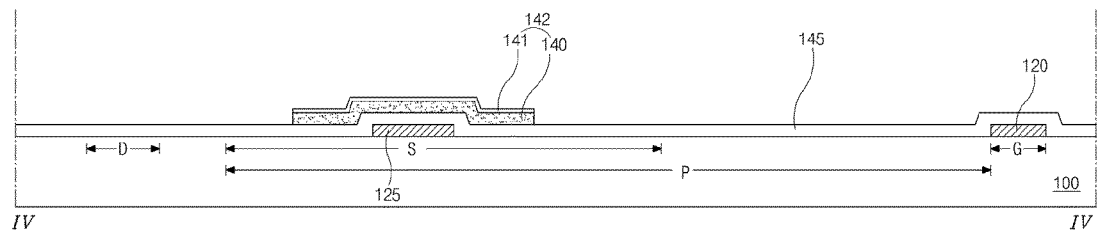

Referring to FIG. 4B, an intrinsic amorphous silicon layer and an impurity-doped amorphous silicon layer are sequentially formed on the gate insulating layer 145 and patterned in a second mask process to form a semiconductor layer 142. The semiconductor layer 142 includes an active layer 140 of intrinsic amorphous silicon and an ohmic contact layer 141 of impurity-doped amorphous silicon.

Figure 4C:
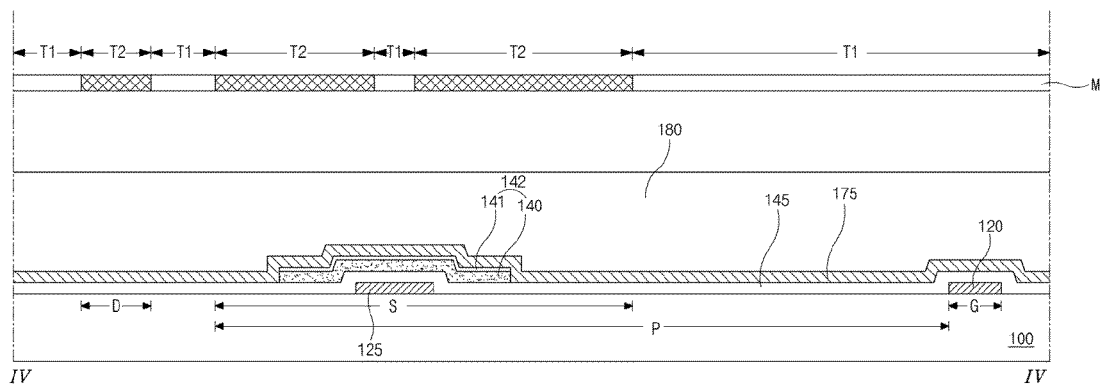

Referring to FIG. 4C, a conductive layer 175 and a photoresist layer 180 are sequentially formed on the substrate 100 having the semiconductor layer 142. The conductive layer 175 may be made of copper group material. The copper group material may be one of copper and copper alloy.

A third mask M is located over the photoresist layer 180. The third mask M includes a transmissive portion T1 and a blocking portion T2. The photoresist layer 180 may be a positive type photoresist layer. The transmissive portion T1 is located between the blocking portions T2 corresponding the switching region S. Further, the blocking portion T2 corresponds to the data region D.

Figure 4D:
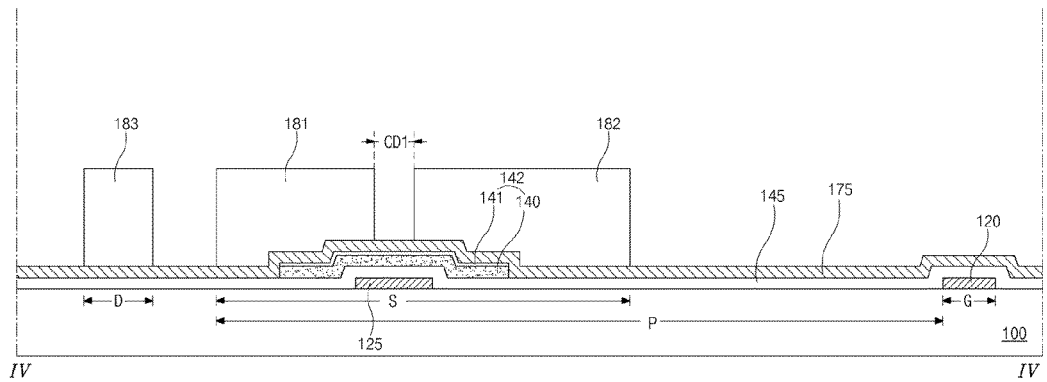

Referring to FIG. 4D, a light exposure process and a developing process are performed for the photoresist layer (180 of FIG. 4C) to form first to third photoresist patterns 181 to 183. The first and second photoresist patterns 181 and 182 correspond to the switching region S and are spaced apart from each other. The third photoresist pattern 183 corresponds to the data region D.

A distance CD 1 between the first and second photoresist patterns 181 and 182 may be about 5 μm. The distance CD1 is substantially the same as a distance between the blocking portions (T2 of FIG. 4C) corresponding to the switching region S. In other words, the distance CD1 is a design value which is desired by a manufacturer.

Figure 4E:
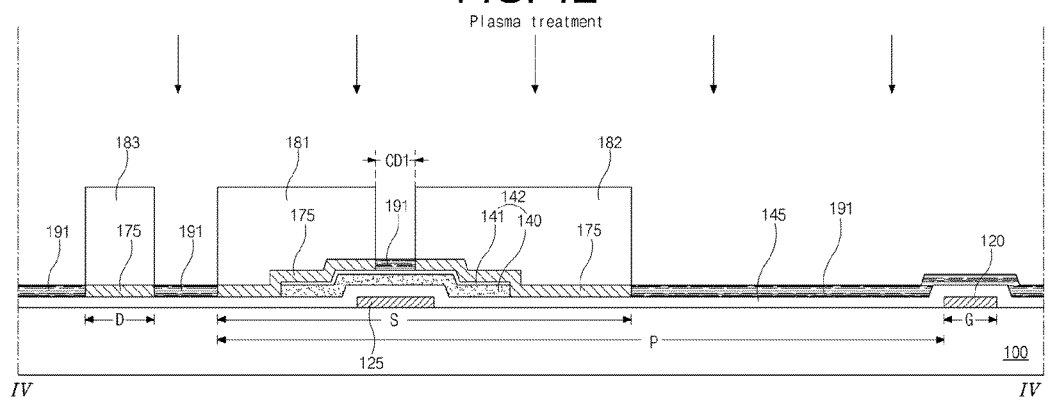

Referring to FIG. 4E, a plasma treatment is performed using the first to third photoresist patterns 181 to 183 as a reaction mask. At least one of a hydrogen bromide (HBr) gas, a hydrogen chloride (HCl) gas and a chlorine ($Cl_2$) gas may be used as a reaction gas for the plasma treatment. A dry etching apparatus may be used as a plasma treatment apparatus. Extent of reaction of the copper group material with the reaction gas may be adjusted according to process conditions, for example, process pressure and process time.

During the plasma treatment, the copper group material layer (175 of FIG. 4D) is reacted with the reaction gas including, for example, at least one of the hydrogen bromide (HBr) gas, hydrogen chloride (HCl) gas and chlorine ($Cl_2$) gas using the first to third photoresist patterns 181 to 183 as the treatment mask, and a copper compound 191 is thus produced at regions exposed between the first to third photoresist patterns 181 to 183.

When the copper group material layer is reacted with the hydrogen bromide (HBr), a copper bromide compound (CuBrx) is produced. When the copper group material is reacted with hydrogen chloride (HCl) or chlorine ($Cl_2$), a copper chloride compound (CuClx) is produced. In other words, the type of the copper compound 191 depends on the type of the reaction gas.

Since the reaction gas in plasma state is substantially reacted with the copper group material layer exposed between the first to third photoresist patterns 181 to 183, the copper group material layer below the first to third photoresist patterns 181 to 183 is not changed into the copper compound.

Since the copper compound has a low vapor pressure, the copper compound is hardly evaporated. The copper compound is not wet-etched using an etchant such as a hydrogen chloride solution and a hydrogen fluoride solution, but the copper compound is reacted with a copper compound removing solution including, for example, a hydrochloric acid diluted with a deionized water, and easily removed. The deionized water may have about 6 weight %.

The copper compound removing solution has selectivity in removing a material, for example, not removing the copper group material but removing the copper bromide compound or copper chloride compound.

Figure 4F:
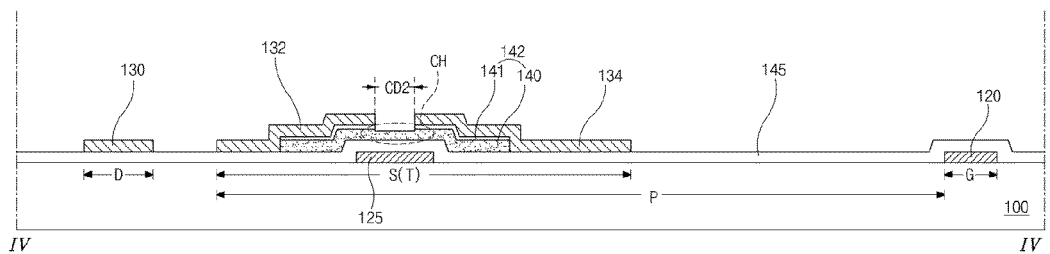

Referring to FIG. 4F, the copper compound (191 of FIG. 4E) is removed using the copper compound removing solution. Accordingly, source and drain electrodes 132 and 134 spaced apart from each other are formed in the switching region S, and a data line 130 is formed in the data region D. In other words, the source electrode 132, the drain electrode 134 and the data line 130 have substantially the same shape and size in plane as the first to third photoresist patterns (181 to 183 of FIG. 4E), respectively. Accordingly, a distance CD2 between the source and drain electrodes 132 and 134 is substantially the same as the distance (CD1 of FIG. 4E) between the first and second photoresist patterns (181 and 182 of FIG. 4E). The distance CD2 may be larger than the first distance CD1 under some other process conditions, but the deviation at each of both sides may be at most about 0.2 μm which is permissible.

The ohmic contact layer 141 is patterned through a dry-etching process using the source and drain electrodes 132 and 134 as an etching mask to form both contact patterns below the source and drain electrodes 132 and 134, respectively. Accordingly, the both contact patterns of the ohmic contact layer 141 has substantially the same shape and size in plane as the source and drain electrodes 132 and 134. Accordingly, a distance between the both contact patterns of the ohmic contact layer 141 is substantially the same as the distance CD2 between the source and drain electrodes 132 and 134. A portion of the active layer 140 between the source and drain electrodes 132 and 134 may be partially dry-etched in the process of dry-etching the ohmic contact layer 141. The portion of the active layer 140 between the source and drain electrodes 132 and 134 is referred to as a channel portion CH. The channel portion CH, which is partially etched at top thereof, may be referred to as a back-etched type channel portion.

The gate electrode 125, the semiconductor layer 142 and the source and drain electrodes 132 and 134 form a thin film transistor T.

As described above, since the distance CD2 between the source and drain electrodes 132 and 134 is substantially the design value, the channel portion CH has substantially a desired length. Accordingly, a property of the thin film transistor T can be improved, and display quality of the LCD device can be thus improved.

The first to third photoresist patterns (181 to 183 of FIG. 4E) are removed through a stripping process.

Figure 4G:
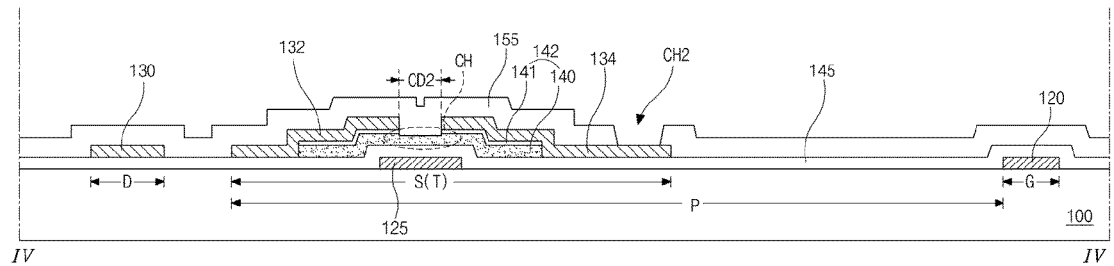

Referring to FIG. 4G, a passivation layer 155 is formed on the substrate 100 having the source and drain electrodes 132 and 134. The passivation layer 155 is patterned in a fourth mask process to form a drain contact hole CH2 exposing the drain electrode 134. The passivation layer 155 may be made of an inorganic insulating material or an organic insulating material. The inorganic insulating material may be one of silicon oxide ($SiO_2$) and silicon nitride (SiNx). The organic insulating material may be one of photo acrylic and benzocyclobutene (BCB).

Figure 4H:
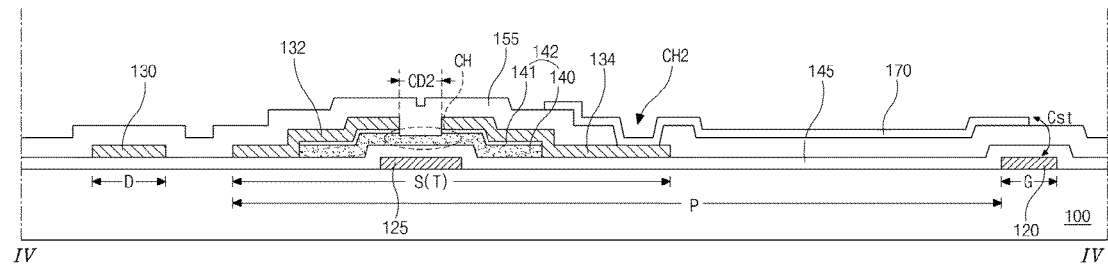

Referring to FIG. 4H, a transparent conductive material is formed on the passivation layer 155 and patterned in a fifth mask process to form a pixel electrode 170 in the pixel region P. The pixel electrode 170 is connected to the drain electrode 134 through the drain contact hole CH2. The pixel electrode 170 may extends over the gate region G and overlap the gate line 120 with the gate insulating layer 145 and the passivation layer 155 therebetween to form a storage capacitor Cst. The conductive material may be one of indium-tin-oxide (ITO), indium-zinc-oxide (IZO) and indium-tin-zinc-oxide (ITZO).

Through the above-described processes, the array substrate according to the first embodiment can be manufactured. Further, through manufacturing an opposing substrate and then attaching the opposing substrate and the array substrate, the LCD device according to the first embodiment can be manufactured.

Figure 5:
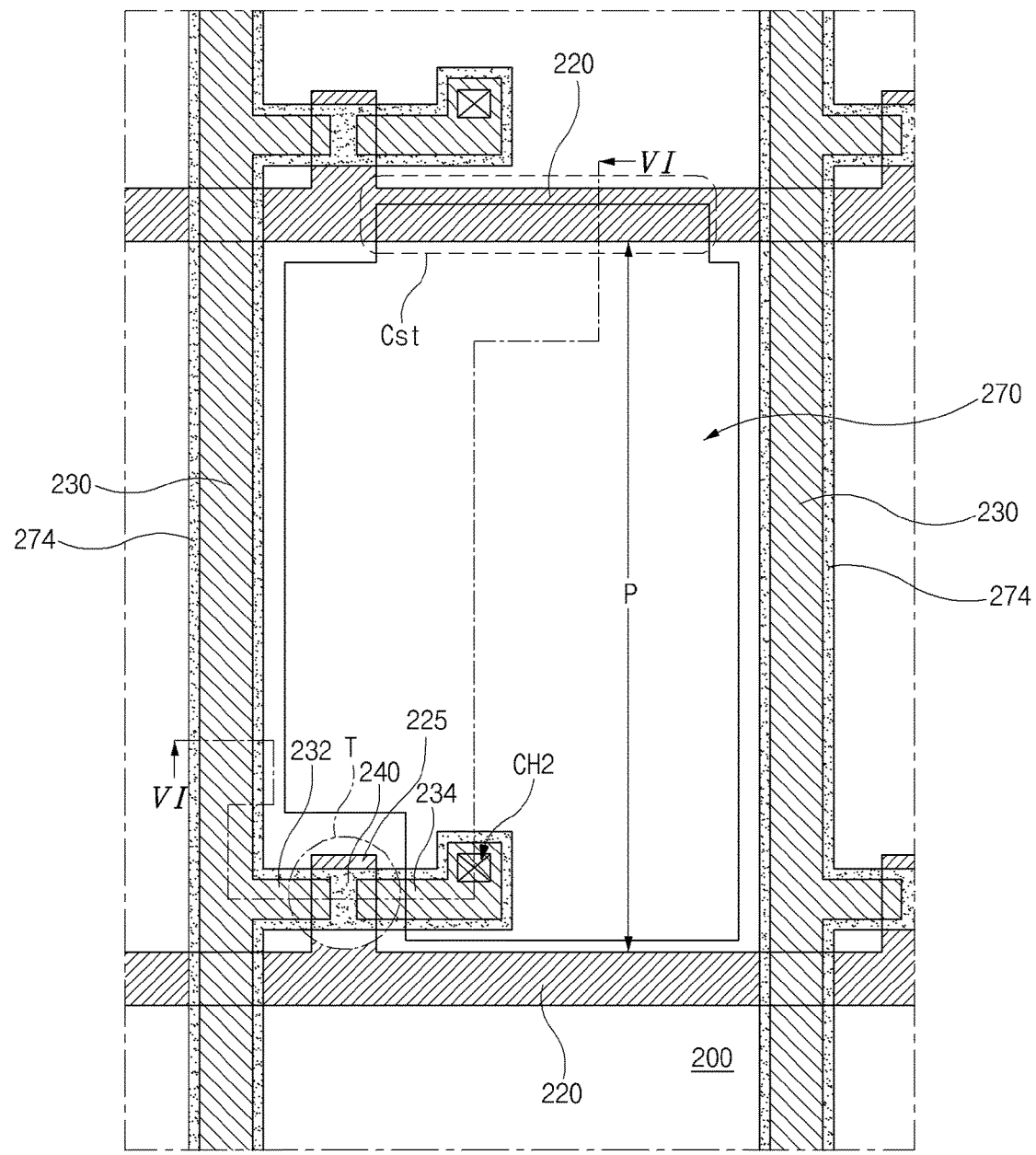
FIG. 5 is a plan view illustrating an array substrate of an LCD device according to a second embodiment of the present invention.

FIG. 5 is a plan view illustrating an array substrate of an LCD device according to a second embodiment of the present invention.

Referring to FIG. 5, the array substrate includes a gate line 220 and a data line 230 crossing each other to define a pixel region P on a substrate 200.

A thin film transistor T is in the pixel region P and connected to the corresponding gate and data lines 220 and 230. The thin film transistor T includes a gate electrode 225, a first semiconductor layer, and source and drain electrodes 232 and 234. The gate electrode 225 is connected to the gate line 220, and the source electrode 232 is connected to the data line 230. The first semiconductor layer includes an active layer 240 of an intrinsic amorphous silicon and an ohmic contact layer of impurity-doped amorphous silicon. The ohmic contact layer includes two separate contact patterns below the source and drain electrodes 232 and 234, respectively.

A second semiconductor layer extends from the first semiconductor layer. The second semiconductor layer extends along and below the data line 230. The second semiconductor layer includes a first pattern 274 and a second pattern. The first pattern 274 extends from the active layer 240, and the second pattern extends from the ohmic contact layer.

A pixel electrode 270 is in the pixel region P and connected to the drain electrode 234 of the thin film transistor T through a drain contact hole CH2. The pixel electrode 270 may overlap the gate line 220 with an insulating layer therebetween to form a storage capacitor Cst.

FIGS. 6A to 6L are cross-sectional views, taken along a line VI-VI of FIG. 5, illustrating a method of manufacturing the array substrate of the LCD device according to the second embodiment of the present invention.

Figure 6A:
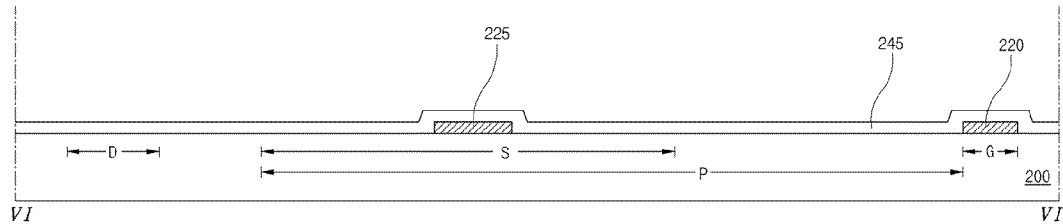
FIGS. 6A to 6L are cross-sectional views, taken along a line VI-VI of FIG. 5, illustrating a method of manufacturing the array substrate of the LCD device according to the second embodiment of the present invention.

Referring to FIG. 6A, a conductive material is deposited on a substrate 200. The substrate 200 includes a switching region S, a pixel region P, a gate region G and a data region D. The conductive pattern is patterned in a first mask process to form a gate line 220 and a gate electrode 225. The conductive material may be made of one of copper (Cu), molybdenum (Mo), aluminum (Al), aluminum alloy and chromium (Cr), or a mixture thereof. The gate line 225 corresponds to the gate region G, and the gate electrode 225 corresponds to the switching region S.

A gate insulating layer 245 is formed on the substrate 200 having the gate electrode 225. The gate insulating layer 245 may be made of an inorganic material. The inorganic material may be one of silicon oxide ($SiO_2$) and silicon nitride (SiNx).

Figure 6B:
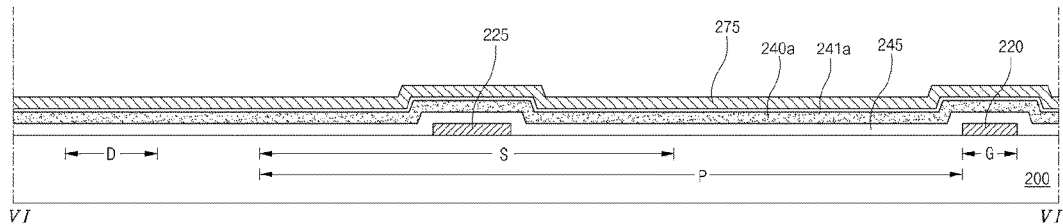

Referring to FIG. 6B, an intrinsic amorphous silicon layer 240a, an impurity-doped amorphous silicon layer 241a and a conductive material layer 275 are sequentially formed on the gate insulating layer 245. The conductive material layer 275 may be made of a copper group material. The copper group material may be one of copper and copper alloy.

Figure 6C:
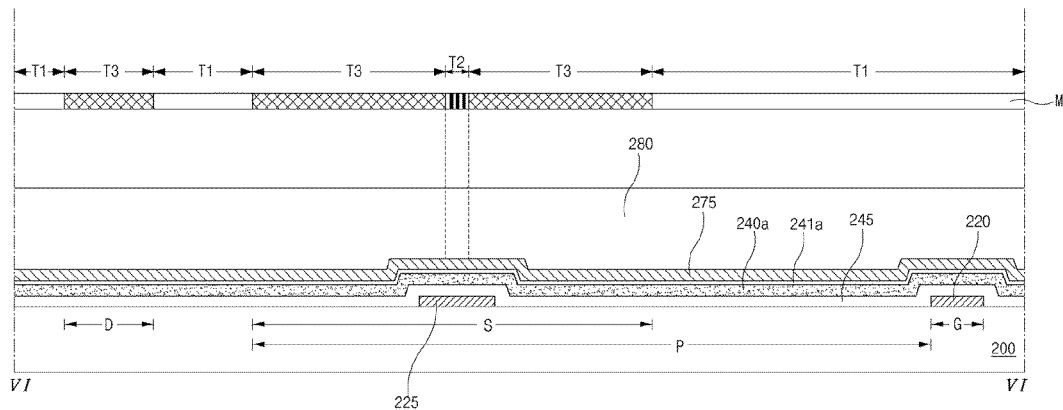

Referring to FIG. 6C, a photoresist layer 280 is formed on the conductive material layer 275. A second mask M is located over the photoresist layer 280. The second mask M includes a transmissive portion T1, a semi-transmissive portion T2 and a blocking portion T3. The photoresist layer 280 may be a positive type photoresist layer. The semi-transmissive portion T2 is located between the blocking portions T3 corresponding the switching region S. Further, the blocking portion T3 corresponds to the data region D. A light transmissivity of the semi-transmissive portion T2 is between a light transmissivity of the transmissive portion T1 and a light transmissivity of the blocking portion T3. A half-tone portion may be used as the semi-transmissive portion T2. Alternatively, a portion, where slits are formed, may be used as the semi-transmissive portion T2.

Figure 6D:
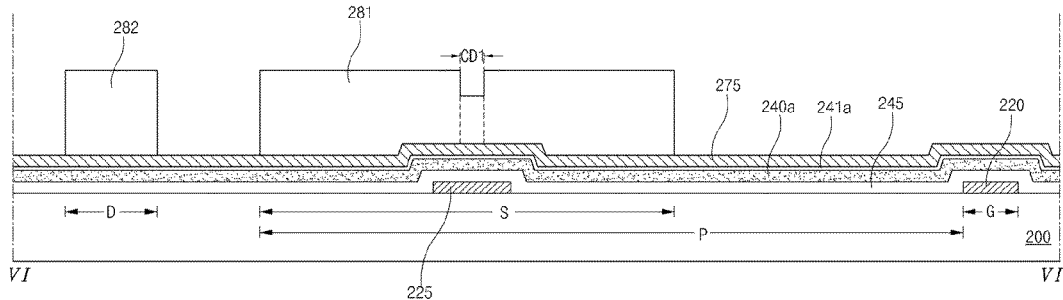

Referring to FIG. 6D, a light exposure process and a developing process are performed for the photoresist layer 280 to form first and second photoresist patterns 281 and 282. The first photoresist pattern 281 corresponds to the switching region S, and the second photoresist pattern 282 corresponds to the data region D. The first photoresist pattern 281 includes first to third portions. The second photoresist pattern 282 and the first and second portions of the first photoresist pattern 281 correspond to the blocking portions (T3 of FIG. 6C), and the third portion of the first photoresist pattern 281 corresponds to the semi-transmissive portion (T2 of FIG. 6C). Accordingly, the third portion of the first photoresist pattern 281 is partially removed in the developing process, and the second photoresist pattern 282 and the first and second portions of the first photoresist pattern 281 are substantially not removed in the developing process. Accordingly, the third portion of the first photoresist pattern 281 has a thickness less than those of the first and second portions of the first photoresist pattern 281. The second photoresist pattern 282 has substantially the same thickness as the first and second portions of the first photoresist pattern 281.

A width of the third portion i.e., a distance CD1 between the first and second portions of the first photoresist pattern 281 may be about 5 μm. The distance CD1 is substantially the same as a distance between the blocking portions (T3 of FIG. 6C) corresponding to the switching region S. In other words, the distance CD1 is a design value which is desired by a manufacturer.

Figure 6E:
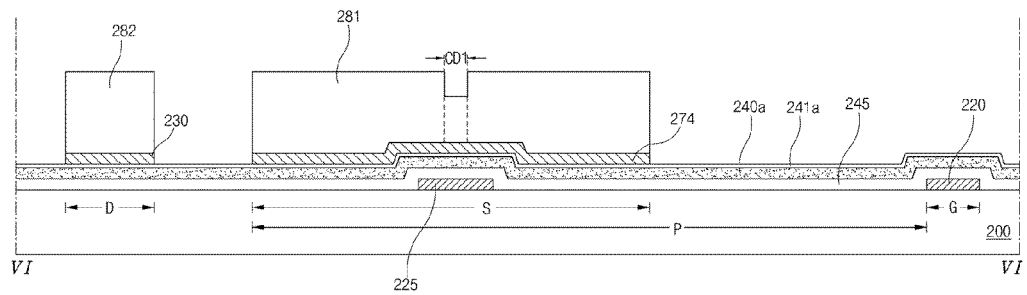

Referring to FIG. 6E, the conductive material layer (275 of FIG. 6D) is etched using the first and second photoresist patterns 281 and 282 as an etching mask to form a data line 230 and a source-drain pattern 274. For example, the conductive material is wet-etched using a hydrogen peroxide ($H_2O_2$) group etching solution. Alternatively, the conductive material layer is removed using the method of the first embodiment, which includes the plasma treatment for the copper group material using a reaction gas including at least one of a hydrogen bromide (HBr) gas, a hydrogen chloride (HCl) gas and a chlorine ($Cl_2$) gas, and the process of removing the copper compound using a copper compound removing solution including, for example, a hydrochloric acid diluted with a deionized water. The deionized water may have about 6 weight %.

The data line 230 is formed below the second photoresist pattern 282, and the source-drain pattern 274 is formed below the first photoresist pattern 281.

Figure 6F:
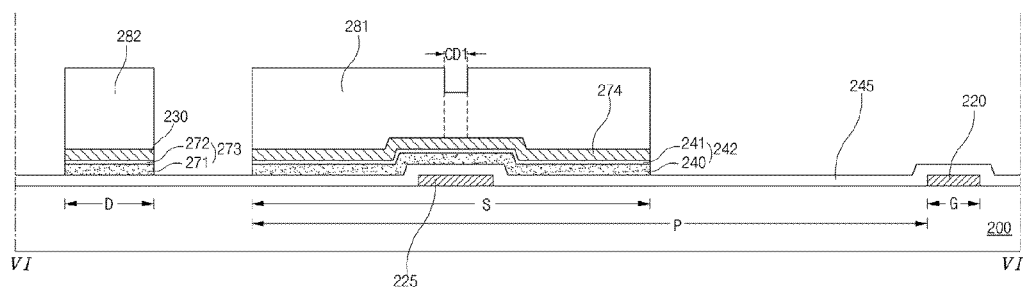

Referring to FIG. 6F, the impurity-doped amorphous silicon layer (241a of FIG. 6E) and the intrinsic amorphous silicon layer (240a of FIG. 6E) are dry-etched to form first and second semiconductor layers 242 and 273. The first semiconductor layer 242 includes an active layer 240 of intrinsic amorphous silicon and an ohmic contact layer 241 of impurity-doped amorphous silicon. The second semiconductor layer 273 includes a first pattern 271 of intrinsic amorphous silicon and a second pattern 272 of impurity-doped amorphous silicon. The first semiconductor layer 242 may have substantially the same shape and size in plane as the source-drain pattern 274. The second semiconductor layer 273 may have substantially the same shape and size in plane as the data line 230.

Figure 6G:
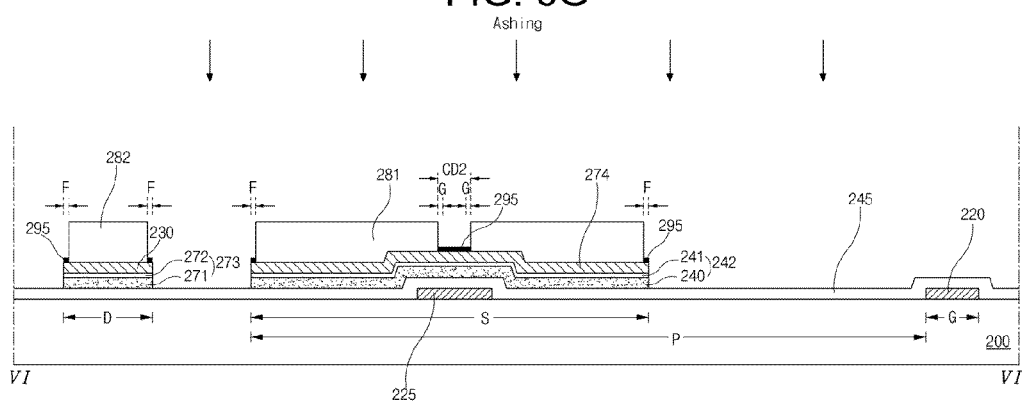

Referring to FIG. 6G, an ashing process is performed for the first and second photoresist patterns 281 and 282 to completely remove the third portion of the first photoresist pattern 281. A mixture gas including, for example, a base gas of oxygen ($O_2$), and an additive gas including at least one of sulfur hexafluoride ($SF_6$) and tetrafluoromethane ($CF_4$) may be used as an ashing gas.

Through the ashing process, the first and second photoresist patterns 281 and 282 are partially removed. Accordingly, width and thickness of each of the first and second photoresist patterns 281 and 282 are reduced. Accordingly, a distance CD2 between the first and second portions of the first photoresist pattern 281 increases. For example, each of the first and second portions of the first photoresist pattern 281 is reduced in a width direction by about 0.5 μm at each side. Accordingly, the distance CD2 becomes about 6 μm (about 5 μm+about 2*0.5 μm).

The references "F" of FIG. 6G indicate reduction in the width direction at the sides of the first and second photoresist patterns 281 and 282 due to the ashing process. The references "G" of FIG. 6G indicate reduction in the width direction at the inner sides of the first and second portions of the first photoresist 281 due to the ashing process. Due to the ashing process, since the data line 230 is not completely covered by the second photoresist pattern 282, and the source-drain pattern 274 is not completely covered by the first photoresist pattern 281, exposed portions of the data line 230 and the source-drain pattern 274 are reacted with the oxygen ($O_2$) gas in the ashing gas. Accordingly, a copper oxide (CuOx) film 295 is produced at the exposed portions of the data line 230 and the source-drain pattern 274. For example, the copper oxide (CuOx) film 295 is formed at a top surface of the exposed portions of the data line 230 and the source-drain pattern 274.

The copper oxide (CuOx) prevents a plasma treatment for a copper group material. In other words, the copper oxide (CuOx) film 295 is formed on the copper group material and functions as a shield film for the plasma treatment. Accordingly, even though the plasma treatment is performed, a reaction gas of hydrogen bromide (HBr), hydrogen chloride (HCl) or chlorine ($Cl_2$) in plasma state could not be reacted with the copper group material. Accordingly, the copper oxide (CuOx) is made to non-exist at the exposed portions. For example, a treatment to deoxidize the copper oxide (CuOx) is performed, which is referred to as a deoxidization treatment.

Figure 6H:
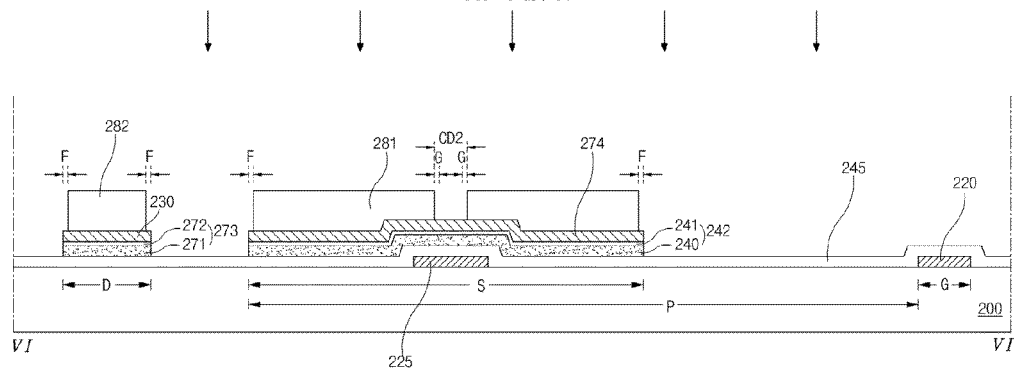

Referring to FIG. 6H, the deoxidization treatment is performed for the copper oxide (CuOx) film (295 of FIG. 6G). The deoxidization treatment is a plasma treatment for the copper oxide (CuOx) film using a deoxidization gas including, for example, at least one of a hydrogen ($H_2$) gas and a hydrogen chloride (HCl) gas. For example, when the hydrogen ($H_2$) gas is used as the deoxidization gas, the hydrogen ($H_2$) in plasma state is reacted with the oxygen (Ox) of the copper oxide (CuOx), and thus hydrogen oxide ($H_2O$) is produced. The produced hydrogen oxide ($H_2O$) is discharged outside of a chamber for the deoxidization treatment, and the copper oxide (CuOx) film is deoxidized. Accordingly, the top surface of the exposed portions of the data line 230 and the source-drain pattern 274 is changed into the copper group material.

Instead of the deoxidization treatment, methods of removing the copper oxide (CuOx) film at the exposed portions may be used. For example, the copper oxide (CuOx) is physically etched using a plasma treatment with an inert gas, for example, a helium (He) gas. The helium (He) in plasma state has high energy so that the helium (He) directly strikes the copper oxide (CuOx) off the exposed portions. Alternatively, the copper oxide (CuOx) is wet-etched using a copper oxide removing solution, for example, an acetic acid. The copper oxide (CuOx) is not wet-etched using an etchant such as a hydrogen chloride solution and a hydrogen fluoride solution, but the copper oxide (CuOx) is reacted with the copper oxide removing solution. The copper oxide removing solution is not reacted with the copper group material. In other words, the copper oxide removing solution has selectivity in removing.

Figure 6I:
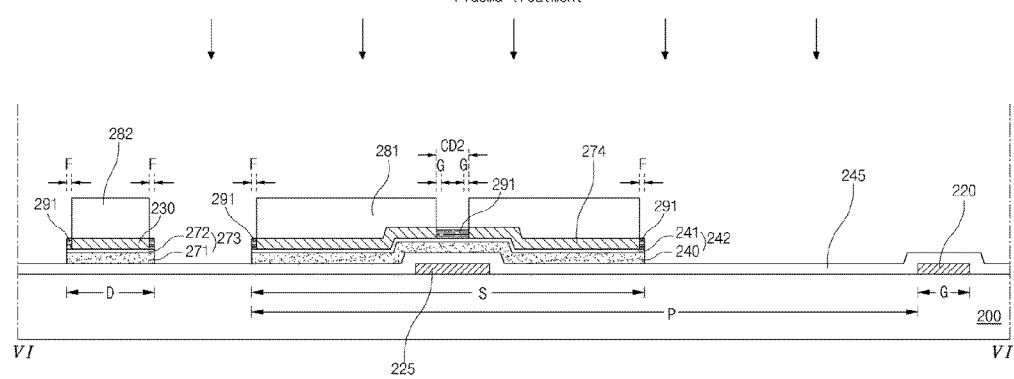

Referring to FIG. 6I, in a similar manner to that of the first embodiment, a plasma treatment is performed using the first and second photoresist patterns 281 and 282 as a reaction mask. At least one of a hydrogen bromide (HBr) gas, a hydrogen chloride (HCl) gas and a chlorine ($Cl_2$) gas may be used as a reaction gas for the plasma treatment. A dry etching apparatus may be used as a plasma treatment apparatus. Extent of reaction of the copper group material with the reaction gas may be adjusted according to process conditions, for example, process pressure and process time.

During the plasma treatment, the copper group material of the exposed portions of the data line 230 and the source-drain pattern 274 is reacted with the reaction gas in plasma state, for example, at least one of the hydrogen bromide (HBr) gas, hydrogen chloride (HCl) gas and chlorine ($Cl_2$) gas using the first and second photoresist patterns 281 and 282 as the reaction mask, and a copper compound 291 is thus produced at the portions corresponding to the references "F" and "G".

When the copper group material is reacted with the hydrogen bromide (HBr), a copper bromide compound (CuBrx) is produced. When the copper group material is reacted with the hydrogen chloride (HCl) or chlorine ($Cl_2$), a copper chloride compound (CuClx) 291 is produced. The type of the copper compound depends on the type of the reaction gas.

Since the reaction gas in plasma state is substantially reacted with the copper group material of the exposed portions of the data line 230 and the source-drain pattern 274, the copper group material below the first and second photoresist patterns 281 and 282 is not changed into the copper compound 291.

Since the copper compound 291 has a low vapor pressure, the copper compound 291 is hardly evaporated. The copper compound 291 is not wet-etched using an etchant such as a hydrogen chloride solution and a hydrogen fluoride solution, but the copper compound 291 is reacted with a copper compound removing solution, for example, a hydrochloric acid diluted with a deionized water and easily removed. The copper compound removing solution is not reacted with the copper group material. In other words, the copper compound removing solution has selectivity in removing.

Figure 6J:
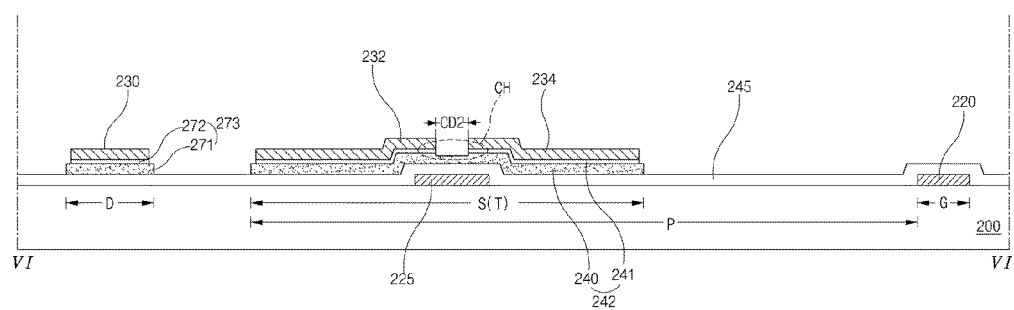

Referring to FIG. 6J, through removing the copper compound (291 of FIG. 6I), source and drain electrodes 232 and 234 spaced apart from each other are formed. In the process of removing the copper compound, the copper group material is not removed, a distance between the source and drain electrodes 232 and 234 is substantially the same as the distance CD2 between the first and second portions of the first photoresist pattern (281 of FIG. 6I). Accordingly, the undesired increase of the distance between the source and drain electrodes due to the over-etching by using the wet-etching solution of the related art can be prevented.

The ohmic contact layer 241 is patterned through a dry-etching process using the source and drain electrodes 232 and 234 as an etching mask to form both contact patterns below the source and drain electrodes 232 and 234, respectively. Accordingly, the both contact patterns of the ohmic contact layer 241 have substantially the same shape and size in plane as the source and drain electrodes 232 and 234. Accordingly, a distance between the both contact patterns of the ohmic contact layer 241 is substantially the same as the distance CD2 between the source and drain electrodes 232 and 234. A portion of the active layer 240 between the source and drain electrodes 232 and 234 may be partially dry-etched in the process of dry-etching the ohmic contact layer 241. The portion of the active layer 240 between the source and drain electrodes 232 and 234 is referred to as a channel portion CH. The channel portion CH, which is partially etched at top thereof, may be referred to as a back-etched type channel portion.

As described above, a length of the channel portion CH is substantially the same as the distance CD2. The distance CD2 is the distance between the first and second portions of the first photoresist pattern. Accordingly, the undesired increase of the length of the channel portion due to the over-etching of the source and drain electrodes can be prevented.

Further, side portions of the ohmic contact layer 241 and the second pattern 272 corresponding to the references "F" of FIG. 6I are also removed. Accordingly, the active layer 240 and the first pattern 271 below the removed side portions of the ohmic contact layer 241 and the second pattern 272 protrude outside from the source and drain electrodes 232 and 234 and the data line 230.

Assumed that the wet-etching is performed in forming the source and drain electrodes from the source-drain pattern, the over-etching occurs, and thus the side portions of the source and drain electrodes are removed more than those of the second embodiment. Further, the data line is wet-etched twice, and thus, the side portions of the data line are removed more than those of the second embodiment. Accordingly, the side portions of the ohmic contact layer and the second pattern are removed more than those of the second embodiment. Accordingly, the active layer and the first pattern protrude outside more than those of the second embodiment. The protrusion of the active layer and the first pattern causes problems in display quality such as wavy noise. Accordingly, the second embodiment can minimize the protrusion of the active layer and the first pattern, and thus display quality can be improved.

The gate electrode 225, the first semiconductor layer 242 and the source and drain electrodes 232 and 234 form a thin film transistor T.

The first and second photoresist patterns (281 and 282 of FIG. 6I) are removed through a stripping process.

Figure 6K:
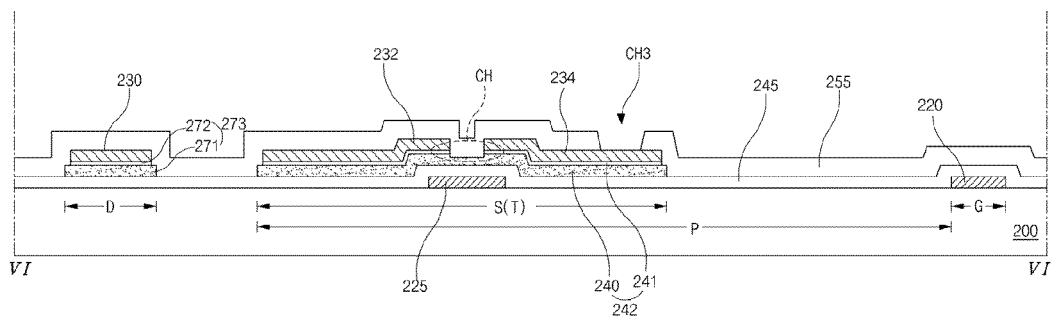

Referring to FIG. 6K, a passivation layer 255 is formed on the substrate 200 having the source and drain electrodes 232 and 234. The passivation layer 255 is patterned in a third mask process to form a drain contact hole CH2 exposing the drain electrode 234. The passivation layer 255 may be made of an inorganic insulating material or an organic insulating material. The inorganic insulating material may be one of silicon oxide ($SiO_2$) and silicon nitride (SiNx). The organic insulating material may be one of photo acrylic and benzocyclobutene (BCB).

Figure 6L:
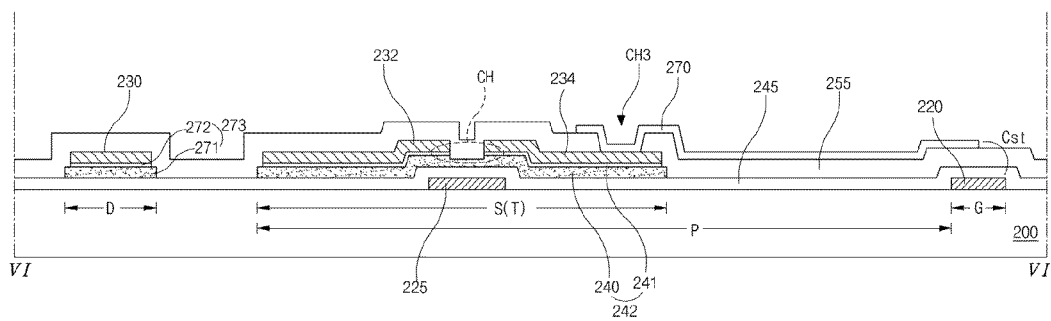

Referring to FIG. 6L, a transparent conductive material is formed on the passivation layer 255 and patterned in a fourth mask process to form a pixel electrode 270 in the pixel region P. The pixel electrode 270 is connected to the drain electrode 234 through the drain contact hole CH2. The pixel electrode 270 may extend over the gate region G and overlap the gate line 220 with the gate insulating layer 245 and the passivation layer 255 therebetween to form a storage capacitor Cst. The conductive material may be one of indium-tin-oxide (ITO), indium-zinc-oxide (IZO) and indium-tin-zinc-oxide (ITZO).

Through the above-described processes, the array substrate according to the second embodiment can be manufactured. Further, through manufacturing an opposing substrate and then attaching the opposing substrate and the array substrate, the LCD device according to the second embodiment can be manufactured.

In the second embodiment, the ashing process, the deoxidization treatment process (or the physical etching process to remove the copper oxide), and the plasma treatment process shown in FIGS. 6G, 6H and 6I may be performed in the same apparatus using plasma through replacing gases in the apparatus according to the corresponding processes. Accordingly, production efficiency can increase and production costs can be reduced.

FIGS. 7A to 7D are cross-sectional views illustrating a method of manufacturing an array substrate of an LCD device according to a third embodiment of the present invention.

FIGS. 7A to 7D of the third embodiment show processes different from those shown in FIGS. 6F to 6I of the second embodiment, and the other processes of the second embodiment may be applied to the third embodiment. Accordingly, in the third embodiment, the processes different form those of the second embodiment are mainly described as follows, and the processes similar to those of the second embodiment may be omitted.

Figure 7A:
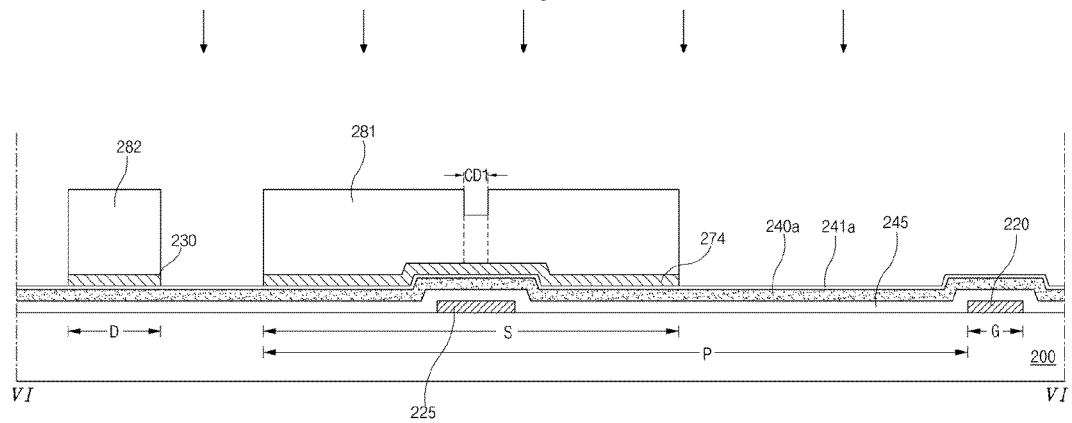
FIGS. 7A to 7D are cross-sectional views illustrating a method of manufacturing an array substrate of an LCD device according to a third embodiment of the present invention.

Referring to FIG. 7A, after forming the data line 230 and the source-drain pattern 274 using the first and second photoresist patterns 281 and 282 as the etching mask, an ashing process is performed for the first and second photoresist patterns 281 and 282. A mixture gas including, for example, a base gas of oxygen ($O_2$), and an additive gas including at least one of sulfur hexafluoride ($SF_6$) and tetrafluoromethane ($CF_4$) may be used as an ashing gas.

Figure 7B:
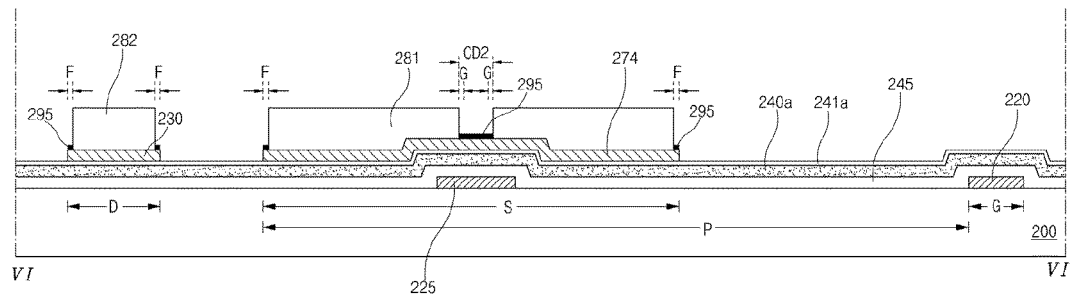

Referring to FIG. 7B, through the ashing process, the third portion of the first photoresist pattern 281 is completely removed, and the first and second portions of the first photoresist pattern 281 and the second photoresist pattern 282 are partially removed. Accordingly, width and thickness of each of the first and second photoresist patterns 281 and 282 are reduced. Accordingly, a distance CD2 between the first and second portions of the first photoresist pattern 281 increases. For example, each of the first and second portions of the first photoresist pattern 281 is reduced in a width direction by about 0.5 μm at each side. Accordingly, the distance CD2 becomes about 6 μm (about 5 μm+about 2*0.5 μm).

Due to the ashing process, since sides of the data line 230 are not covered by the second photoresist pattern 282, and sides of the source-drain pattern 274 are not covered by the first photoresist pattern 281, exposed portions of the data line 230 and the source-drain pattern 274 are reacted with the oxygen ($O_2$) gas in the ashing gas. Accordingly, a copper oxide (CuOx) film 295 is produced at the exposed portions of the data line 230 and the source-drain pattern 274. For example, the copper oxide (CuOx) film 295 is formed at a top surface of the exposed portions of the data line 230 and the source-drain pattern 274.

Figure 7C:
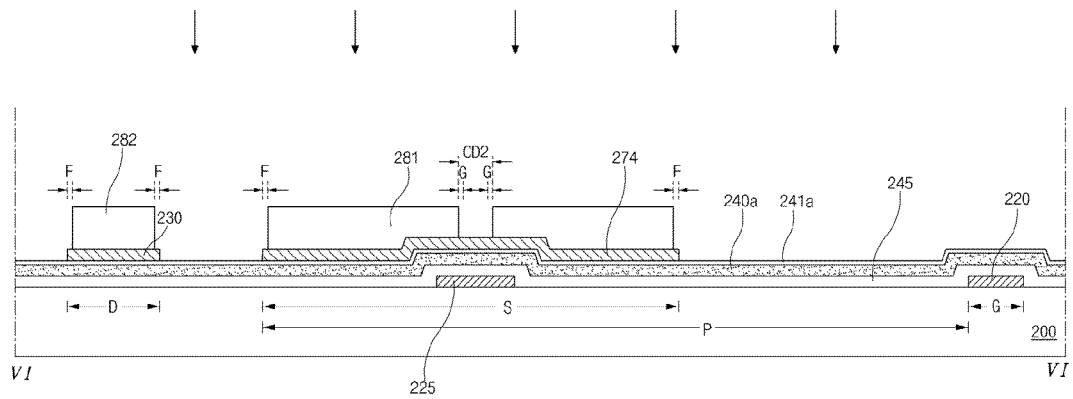

Referring to FIG. 7C, a deoxidization treatment is performed for the copper oxide (CuOx) film (295 of FIG. 7B). The deoxidization treatment is a plasma treatment for the copper oxide (CuOx) film using a deoxidization gas including, for example, at least one of a hydrogen ($H_2$) gas, a hydrogen chloride (HCl) gas and a helium (He) gas. For example, when the hydrogen ($H_2$) gas is used as the deoxidization gas, the hydrogen ($H_2$) in plasma state is reacted with the oxygen (Ox) of the copper oxide (CuOx), and thus hydrogen oxide ($H_2O$) is produced. The produced hydrogen oxide ($H_2O$) is discharged outside of a chamber for the deoxidization treatment, and the copper oxide (CuOx) film is deoxidized. Accordingly, the top surface of the exposed portions of the data line 230 and the source-drain pattern 274 is changed into the copper group material.

Alternatively, the methods to remove the copper oxide (CuOx), as described in the second embodiment, may be used.

Figure 7D:
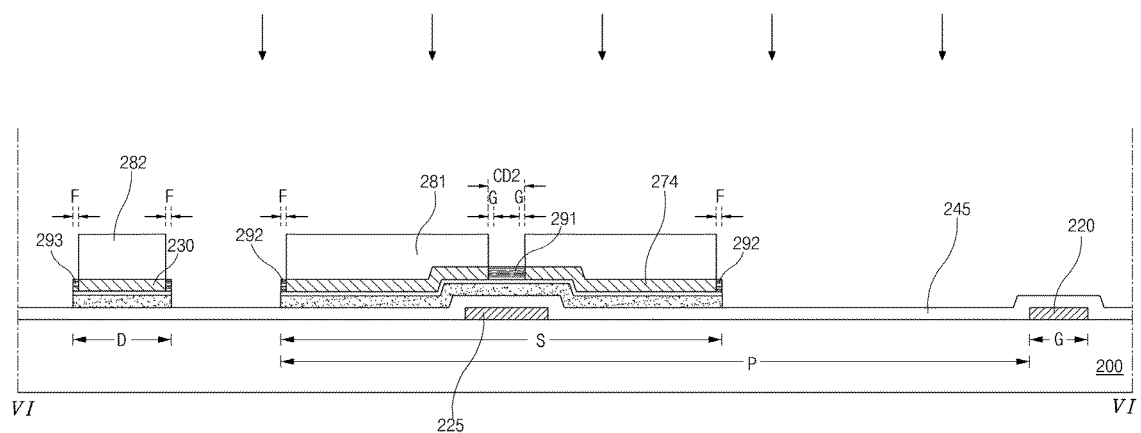

Referring to FIG. 7D, the impurity-doped amorphous silicon layer (241a of FIG. 7C) and the intrinsic amorphous silicon layer (240a of FIG. 7C) are dry-etched to form first and second semiconductor layers 242 and 273. The source-drain pattern 274 and the data line 230 may be used as an etching mask. The first semiconductor layer 242 includes an active layer 240 of intrinsic amorphous silicon and an ohmic contact layer 241 of impurity-doped amorphous silicon. The second semiconductor layer 273 includes a first pattern 271 of intrinsic amorphous silicon and a second pattern 272 of impurity-doped amorphous silicon. The first semiconductor layer 242 may have the same shape and size in plane as the source-drain pattern 274. The second semiconductor layer 273 may have the same shape and size in plane as the data line 230.

A dry-etching gas may include at least one of a hydrogen chloride (HCl) gas, carbon tetrachloride ($CCl_4$) and chlorine ($Cl_2$). In the dry-etching process, the chloride (Cl) in plasma state is produced from the hydrogen chloride (HCl) gas, the carbon tetrachloride ($CCl_4$) gas or the chlorine ($Cl_2$) gas and reacted with the copper group material of the exposed portions of the data line 230 and the source and drain electrodes 232 and 234. Accordingly, the copper compound i.e., the copper chloride (CuClx) is produced at the exposed portions of the data line 230 and the source and drain electrodes 232 and 234.

After forming the copper chloride (CuClx), the copper chloride (CuClx) is removed using the copper compound removing solution as described in the second embodiment. The subsequent processes may be performed as described in the second embodiment.

As described above, the third embodiment does not employ a separate plasma treatment process. During the dry-etching process, a plasma treatment is performed for the exposed portions of the data line and the source and drain electrodes. Accordingly, the method of manufacturing the array substrate according to the third embodiment can omit the separate plasma treatment, and thus production efficiency can increase and production costs can be reduced.

Further, in the third embodiment, the ashing process, the deoxidization treatment process (or the physical etching process to remove the copper oxide), and the dry-etching process shown in FIGS. 7A to 7D may be performed in the same apparatus using plasma through replacing gases in the apparatus according to the corresponding processes. Accordingly, production efficiency can increase and production costs can be reduced.

In the embodiments of the present invention, the methods of manufacturing the array substrate through the five mask processes or four mask processes are mainly described. However, it should be understood that the present invention is not limited to a number of mask processes and any other mask processes can be employed. Further, any type of LCD devices, for example, a TN (twisted nematic) type, a IPS (in-plane switching) type, a VA (vertical aligned) type, and an ECB (electrically controlled birefringence) type can be employed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device, comprising:
    forming a gate line and a gate electrode on a substrate, the gate electrode in a switching region of the substrate;
    forming a gate insulating layer on the gate line and the gate electrode;

forming an intrinsic amorphous silicon layer, an impurity-doped amorphous silicon layer and a copper group material layer which are sequentially located on the gate insulating layer, the copper group material being one of copper and copper alloy;

forming first and second photoresist patterns on the copper group material layer, wherein the first photoresist pattern corresponds to the switching region and includes first to third portions, wherein the third portion is between the first and second portions and has a thickness less than a thickness of the second photoresist pattern and the first and second portions, and wherein the second photoresist pattern corresponds to a data region of the substrate;

patterning the copper group material layer using the first and second photoresist patterns to form a source-drain pattern below the first photoresist pattern and a data line below the second photoresist pattern;

ashing the first and second photoresist patterns to remove the third portion, whereby a copper oxide film is formed at portions of the data line and the source-drain pattern exposed between the ashed first and second photoresist patterns and between the ashed first and second portions;

deoxidizing or removing the copper oxide film;

performing a plasma treatment to change the exposed portions of the data line and the source-drain pattern into a copper compound after deoxidizing or removing the copper oxide film;

removing the copper compound using a copper compound removing solution to form source and drain electrodes below the ashed first and second portions, respectively, wherein the copper compound removing solution substantially has no reaction with the copper group material;

dry-etching a portion of an ohmic contact layer between the source and drain electrodes using the source and drain electrodes as an etching mask, the ohmic contact layer formed by patterning the impurity-doped amorphous silicon layer; and forming a pixel electrode connected to the drain electrode.

2. The method according to claim 1, wherein the copper compound removing solution includes a hydrochloric acid diluted with a deionized water.

3. The method according to claim 1, wherein deoxidizing the copper oxide film is performed using a deoxidization gas which includes at least one of a hydrogen ($H_2$) gas, a hydrogen chloride (HCl) gas.

4. The method according to claim 1, wherein removing the copper oxide film is performed through a physical-etching using a helium (He) gas, or through a wet-etching using an acetic acid.

5. The method according to claim 1, wherein an active layer is formed by patterning the intrinsic amorphous silicon when the ohmic contact layer is formed by patterning the impurity-doped amorphous silicon.

6. The method according to claim 1, wherein the oxide film is formed through a reaction of the exposed portions of the data line and the source-drain pattern with an oxygen ($O_2$) gas in an ashing gas.

7. The method according to claim 1, wherein forming the ohmic contact layer by patterning the impurity-doped amorphous silicon is performed through a dry-etching before ashing the first and second photoresist patterns.

8. The method according to claim 7, wherein the plasma treatment is performed using a reaction gas which includes at least one of a hydrogen bromide (HBr) gas, a hydrogen chloride (HCl) gas and a chlorine ($Cl_2$) gas.

9. The method according to claim 1, wherein the plasma treatment is performed through dry-etching the impurity-doped amorphous silicon to form the ohmic contact layer.

10. The method according to claim 9, wherein dry-etching the impurity-doped amorphous silicon is performed using a dry-etching gas which includes at least one of hydrogen chloride (HCl), carbon tetrachloride ($CCl_4$) and chlorine ($Cl_2$).

* * * * *